(12) United States Patent
Barsun

(10) Patent No.: US 6,477,051 B1
(45) Date of Patent: Nov. 5, 2002

(54) SOCKET ACTIVATION INTERLOCK

(75) Inventor: Stephan Karl Barsun, Auburn, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/957,166

(22) Filed: Sep. 20, 2001

(51) Int. Cl.[7] ............................................. H05K 7/20
(52) U.S. Cl. ..................... 361/704; 361/707; 361/709; 361/710; 361/719; 361/720; 439/342; 165/80.3; 165/80.2; 165/185
(58) Field of Search ............................ 361/702–707, 361/709–711, 717–719, 722; 257/718–727, 706, 713; 165/80.1, 80.3, 185; 174/16.3; 439/342, 259; 24/459

(56) References Cited

U.S. PATENT DOCUMENTS

| | | | | |
|---|---|---|---|---|
| 5,256,080 A | * | 10/1993 | Bright | 439/269 |
| 5,707,247 A | * | 1/1998 | Konstad | 439/342 |
| 5,893,770 A | * | 4/1999 | Gober | 439/342 |
| 6,144,999 A | * | 12/2000 | McCutchan et al. | 439/342 |
| 6,145,499 A1 | * | 1/2001 | Adams et al. | 361/704 |
| 6,219,241 B1 | * | 4/2001 | Jones | 361/704 |
| 6,243,267 B1 | * | 6/2001 | Chuang | 361/704 |
| 6,280,222 B1 | * | 8/2001 | Walkup | 439/331 |
| 6,332,251 B1 | * | 12/2001 | Ho et al. | 24/459 |

* cited by examiner

Primary Examiner—Boris Chervinsky

(57) ABSTRACT

A method and apparatus to encourage correct operator assembly and disassembly of a component in a socket, when the component has a heat dissipation device attached to a substrate. A first embodiment of the invention involves a method to assemble a component and a heat dissipation and/or attachment device to a socket on a substrate using an activation interlock. A second embodiment of the invention involves a method to disassemble a component and a heat dissipation and/or attachment device from a socket on a substrate using an activation interlock. A third embodiment of the invention involves an assembled substrate with an activation interlock to limit operator ability to open and close a socket holding a component relative to the engagement and disengagement of a heat dissipation and/or attachment device attached to the component.

26 Claims, 7 Drawing Sheets

US 6,477,051 B1

SOCKET ACTIVATION INTERLOCK

BACKGROUND OF THE INVENTION

1. Field of the Invention

This invention relates generally to preventing damage to component sockets on cards, and more particularly to preventing damage caused when opening zero-insertion-force sockets when heat dissipation device retention hardware is still attached to the substrate.

2. Description of the Prior Art

In many data processing systems (e.g., computer systems, programmable electronic systems, telecommunication switching systems, control systems, and so forth) one or more components are attached to substrates (e.g., printed circuit boards, or other types of motherboards) on sockets for easy removal and replacement. If a zero-insertion-force (ZIF) socket is used to make contact between the component and substrate and is opened after the component's heat dissipation and/or attachment device is released from the substrate, there is no damage caused to the ZIF socket or substrate. However, if the ZIP socket is opened while a component's heat dissipation and/or attachment device is still attached to the substrate, there is a lateral force imparted to the ZIF socket, typically causing permanent damage to the ZIF socket and substrate, and creating a need for major repair work to the ZIP socket and substrate.

Conventional substrates presently have no mechanism to prevent substrate and socket damage by an operator mistake in sequentially opening the ZIF socket before releasing the heat dissipation device attachment to the substrate.

FIG. 1 illustrates conventional attachment of a heat dissipation/attachment device (e.g., a heatsink, heat-pipe, attachment device, cooling fan, or an equivalent device) 204 to a substrate (e.g., a printed circuit board) 206, on top of a component (e.g., a processor) 212 and a socket 214 (e.g., a ZIF socket). The heat dissipation/attachment device 204 comprises a vertically stacked plurality of rectangular heat dissipation fins 108, and includes two or more walls 118 (one is shown), and typically fabricated of the same metal as the heat dissipation/attachment device 204. The heat dissipation/attachment device 204 holds a plurality of screws 120 (typically four long screws are used) and screw springs 122 to attach a base 106 of the heat dissipation/ attachment device 204 to the substrate 206. There is typically no mechanism to hold the heat dissipation/attachment device 204 on the component 212 on the substrate 206 in such a way as to require releasing the heat dissipation/ attachment device attachments (e.g., the screws 120) before releasing the socket 214.

What is needed is an interlock that forces a human operator to assemble or disassemble a component in a socket from a substrate in such a way as to avoid damage to the socket and substrate holding the component.

SUMMARY OF THE INVENTION

The present invention provides an interlock that forces a human operator to assemble or disassemble a component in a socket from a substrate in such a way as to avoid damage to the socket and substrate holding the component.

A first aspect of the invention is directed to a method to assemble a component and heat dissipation/attachment device to a socket on a substrate using an activation interlock. The method includes attaching the component to the heat dissipation/attachment device; placing the component in the socket on the substrate; activating the socket to engage the component in the socket; and attaching the heat dissipation/attachment device to the substrate using an activation interlock, wherein the activation interlock prevents attachment of the heat dissipation/attachment device to the substrate until after the socket is activated.

A second aspect of the invention is directed to a method to disassemble a component and heat dissipation/attachment device from a socket on a substrate using an activation interlock. The method includes disengaging the heat dissipation/attachment device from the substrate; opening the socket; and removing the component from the socket, wherein the activation interlock prevents the opening of the socket until after disengaging of the heat dissipation/ attachment device from the substrate.

A third aspect of the invention is directed to an assembled substrate with an activation interlock to limit operator ability to open and close a socket holding a component, relative to the engagement and disengagement of a heat dissipation/ attachment device attached to the component. The assembled substrate includes a substrate; a socket mounted on the substrate, including a socket control to open or close the socket; a component inserted in the socket; and a heat dissipation/attachment device attached by one or more retention hardware pieces to the substrate, wherein the heat dissipation device includes an activation interlock to limit operator access to the socket control.

These and other objects and advantages of the invention will become apparent to those skilled in the art from the following detailed description of the invention and the accompanying drawings.

DETAILED DESCRIPTION OF PREFERRED EMBODIMENTS OF THE INVENTION

The present invention provides an interlock to prevent damage to a socket (e.g., a zero-insertion-force socket) when a component's heat dissipation and/or attachment device is not released before the release of the socket. While the discussion below is directed to an application of the invention to secure components to a substrate, such as a printed circuit board (PCB), the invention can also be applied to any type of component attached on any type of substrate (e.g., a multi-chip module, or another substrate upon which electrical components can be assembled).

Figure 1:
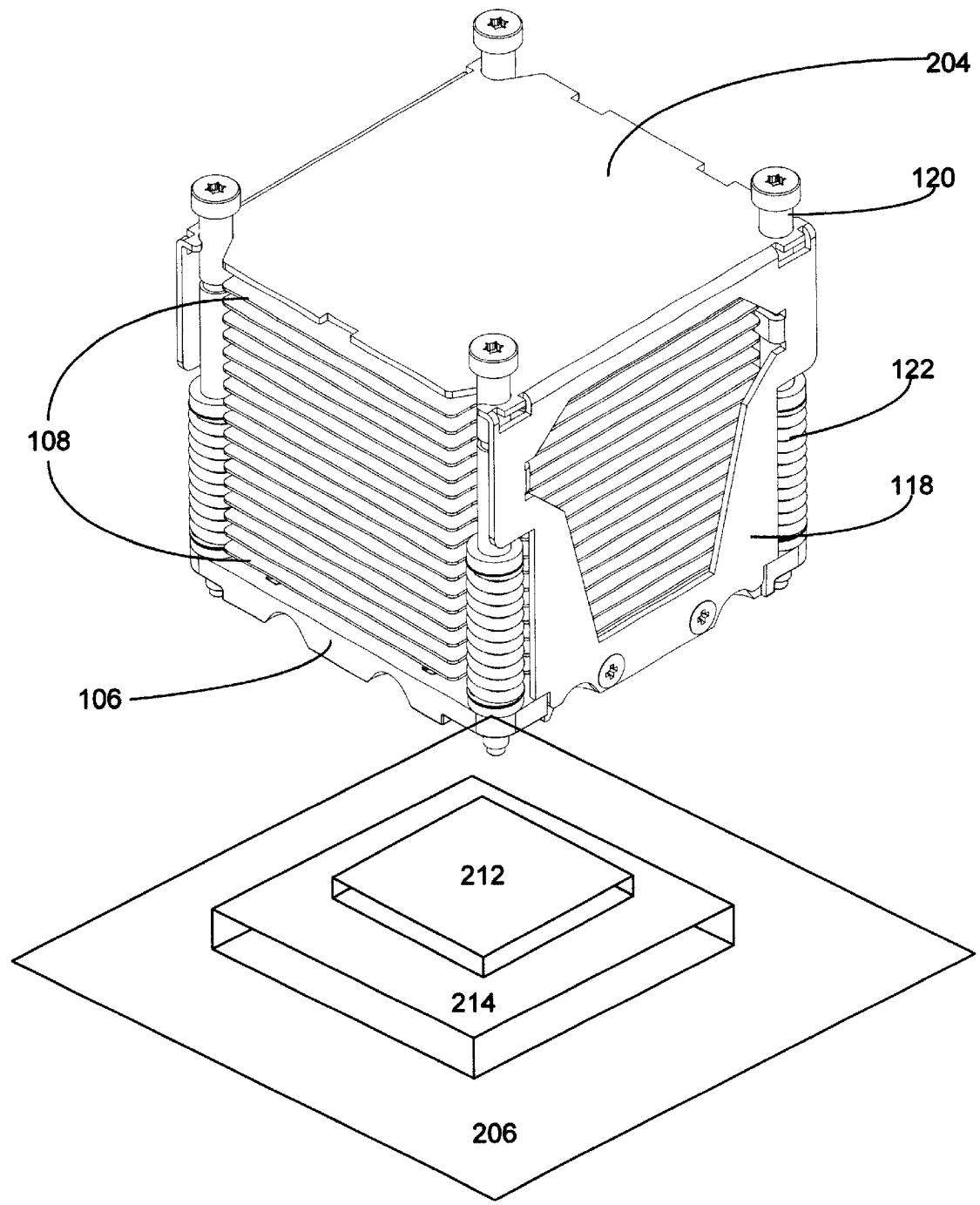
FIG. 1 illustrates conventional attachment of a heat dissipation/attachment device to a substrate, on top of a component and a socket.
Figure 2:
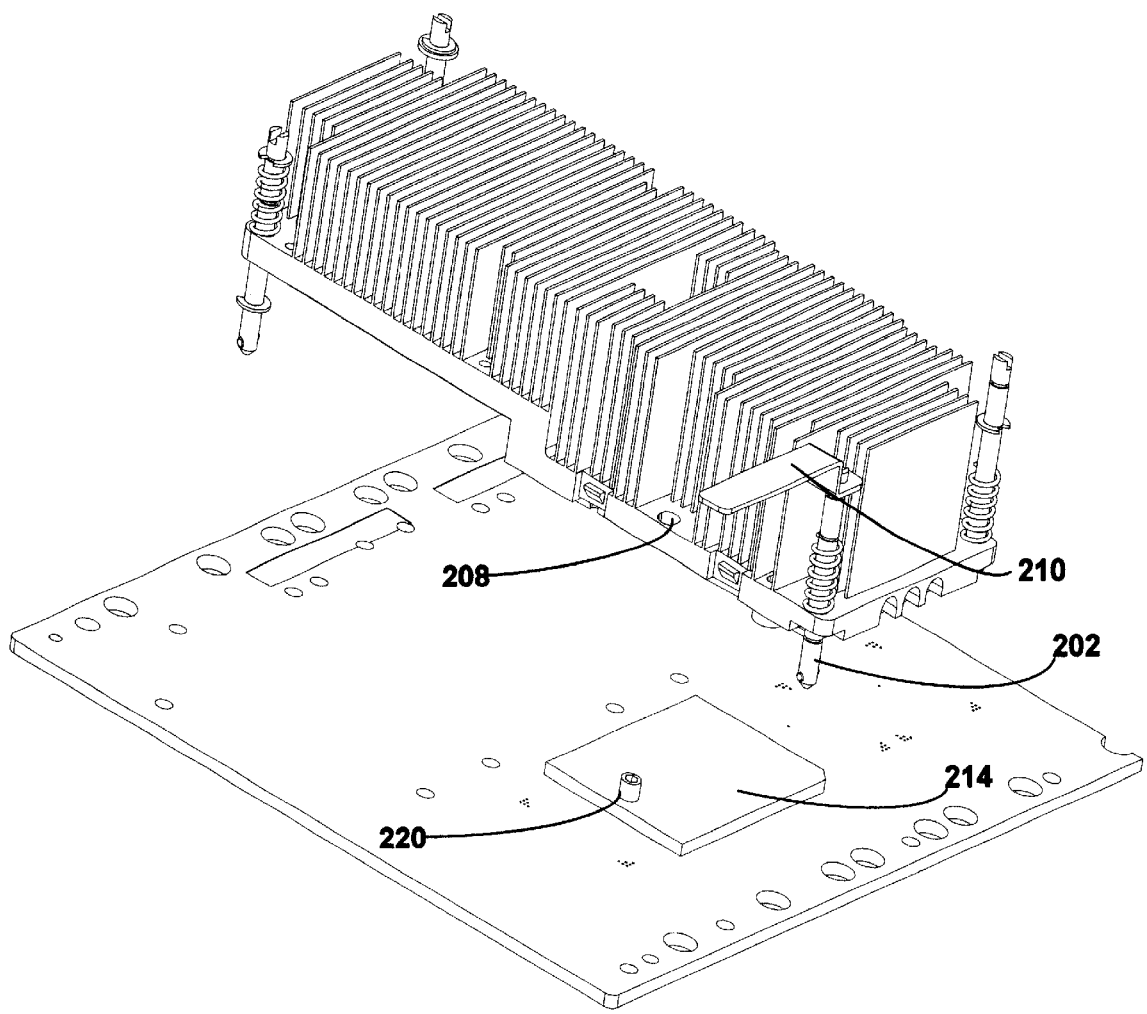
FIG. 2 illustrates a perspective view of one preferred embodiment of the present invention using four quarter-turn retention hardware pieces to attach a heat dissipation/ attachment device to a substrate, on top of a component and a socket.

FIG. 2 illustrates a perspective view of one preferred embodiment of the present invention using four quarter-turn retention hardware pieces 202 to attach a heat dissipation/attachment device (e.g., a heatsink, heat-pipe, attachment device, cooling fan, or an equivalent) 204 to a substrate (e.g., a PCB, multi-chip module, or other substrate) 206, on top or a component (e.g., a processor, or an electronic device, not shown) and socket (e.g., a ZIF socket or an equivalent) 214. A hole 208 provides access to a socket control 220 to engage or disengage the socket 214, and an activation interlock 210 is attached to one of the quarter-turn retention hardware pieces 202 so that when the quarter-turn retention hardware piece 202 is rotated 90 degrees clockwise into the closed and engaged position, it blocks operator access through hole 208 to the socket control 220 used to engage or disengage the socket 214.

The activation interlock 210 is preferably made by molding, stamping, or machining a piece of material. The activation interlock 210 can be fabricated from a piece of sheet metal, a molded piece of metal, a machined piece of metal, a molded piece of plastic, or a machined piece of plastic.

Figure 3:
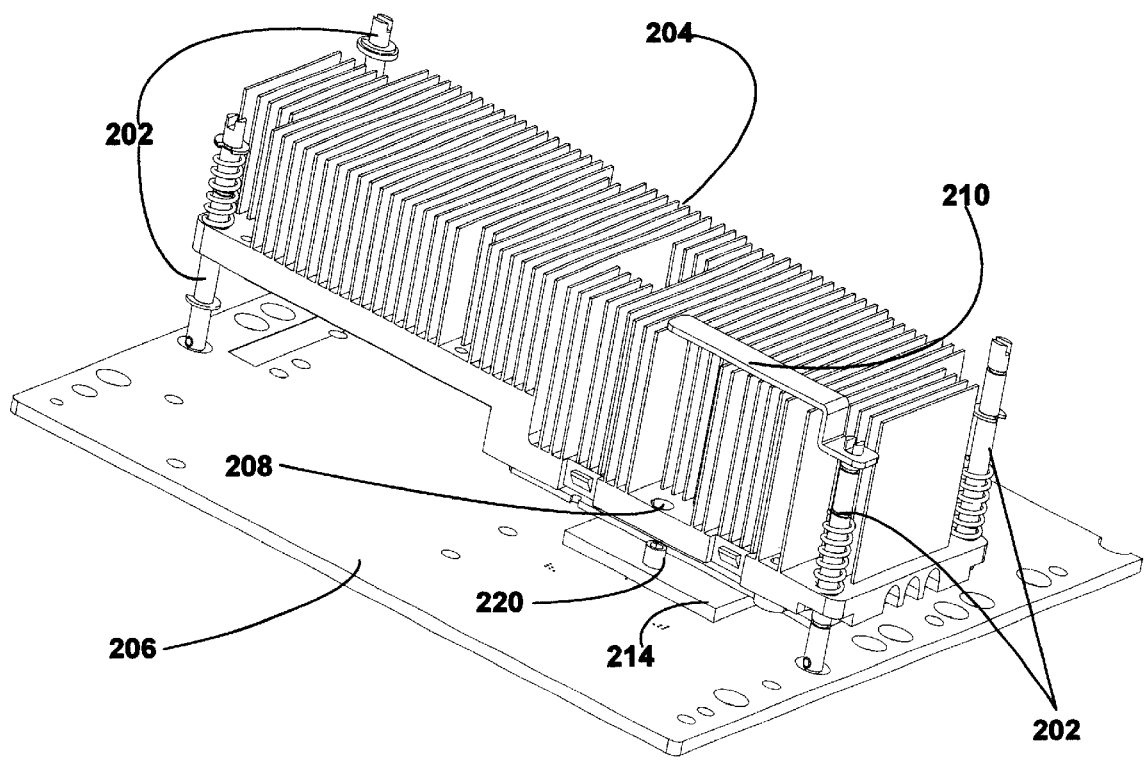
FIG. 3 illustrates a perspective view of a preferred embodiment of the present invention, where the activation interlock is in a closed and engaged position.

FIG. 3 illustrates a perspective view of a preferred embodiment of the present invention, where the activation interlock 210 is in a closed and engaged position. This embodiment also has four quarter-turn retention hardware pieces 202 to attach a heat dissipation/attachment device 204 to a substrate 206 on top of a component 212 (not shown) and socket 214. A hole 208 provides access to engage or disengage the socket 214, and the activation interlock 210 is attached to one of the quarter-turn retention hardware pieces 202 so that when the quarter-turn retention hardware piece 202 is rotated 90 degrees clockwise into the closed and engaged position, it blocks operator access through hole 208 to the socket control 220 used to engage or disengage the socket 214.

Figure 4:
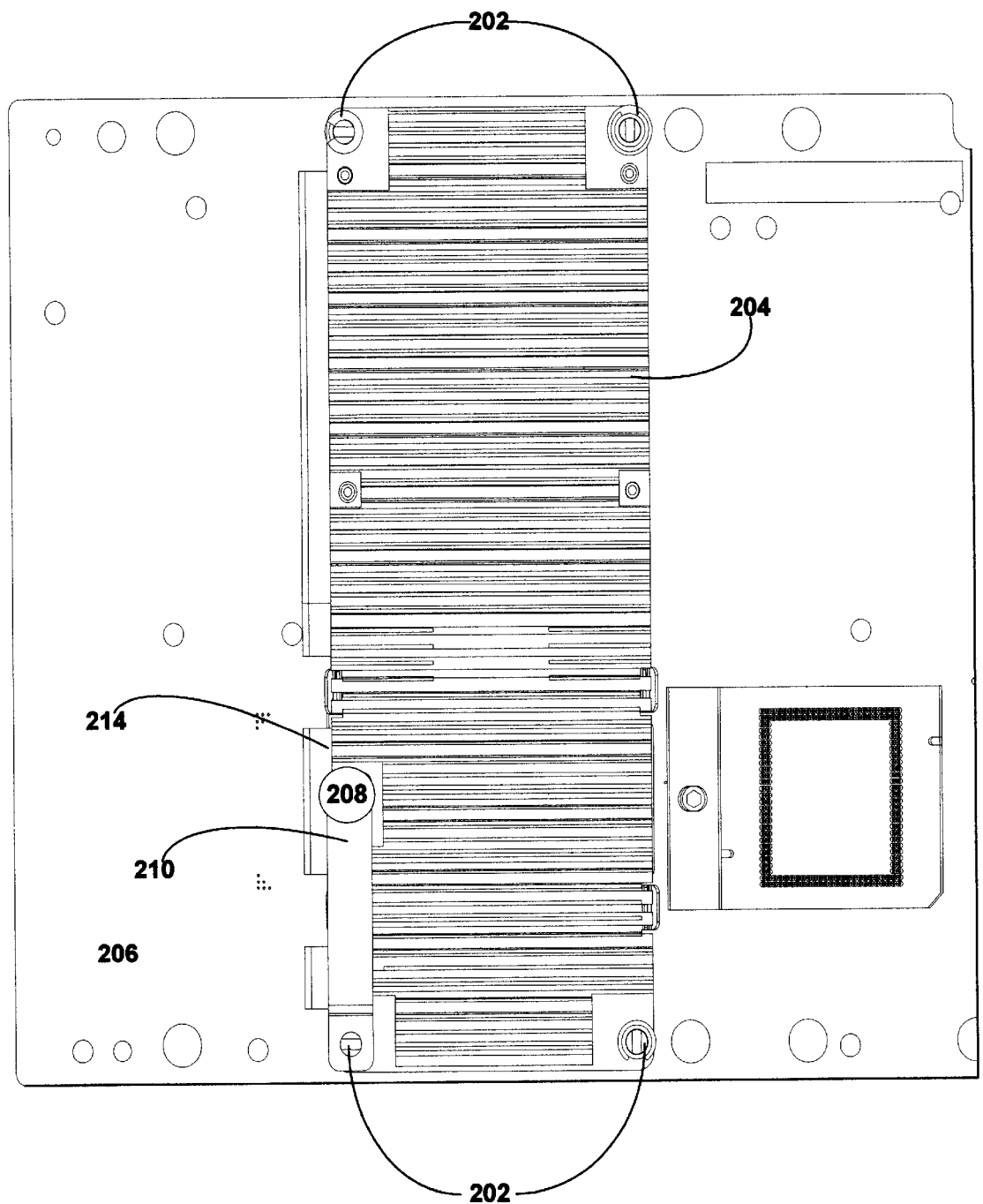
FIG. 4 illustrates a top-down view of a preferred embodiment of the present invention, where the activation interlock is in a closed and engaged position.

FIG. 4 illustrates a top-down view of a preferred embodiment of the present invention, where the activation interlock 210 is in a closed and engaged position. This embodiment has four quarter-turn retention hardware pieces 202 to attach a heat dissipation/attachment device 204 to a substrate 206 on top of a component 212 (not shown) and a socket 214. A hole 208 provides access to engage or disengage the socket 214, the activation interlock 210 is attached to one of the quarter-turn retention hardware pieces 202 so that when the quarter-turn retention hardware piece 202 is rotated 90 degrees clockwise into the closed and engaged position, the activation interlock 210 blocks operator access through hole 208 to the socket control (not shown) used to engage or disengage the socket 214.

Figure 5:
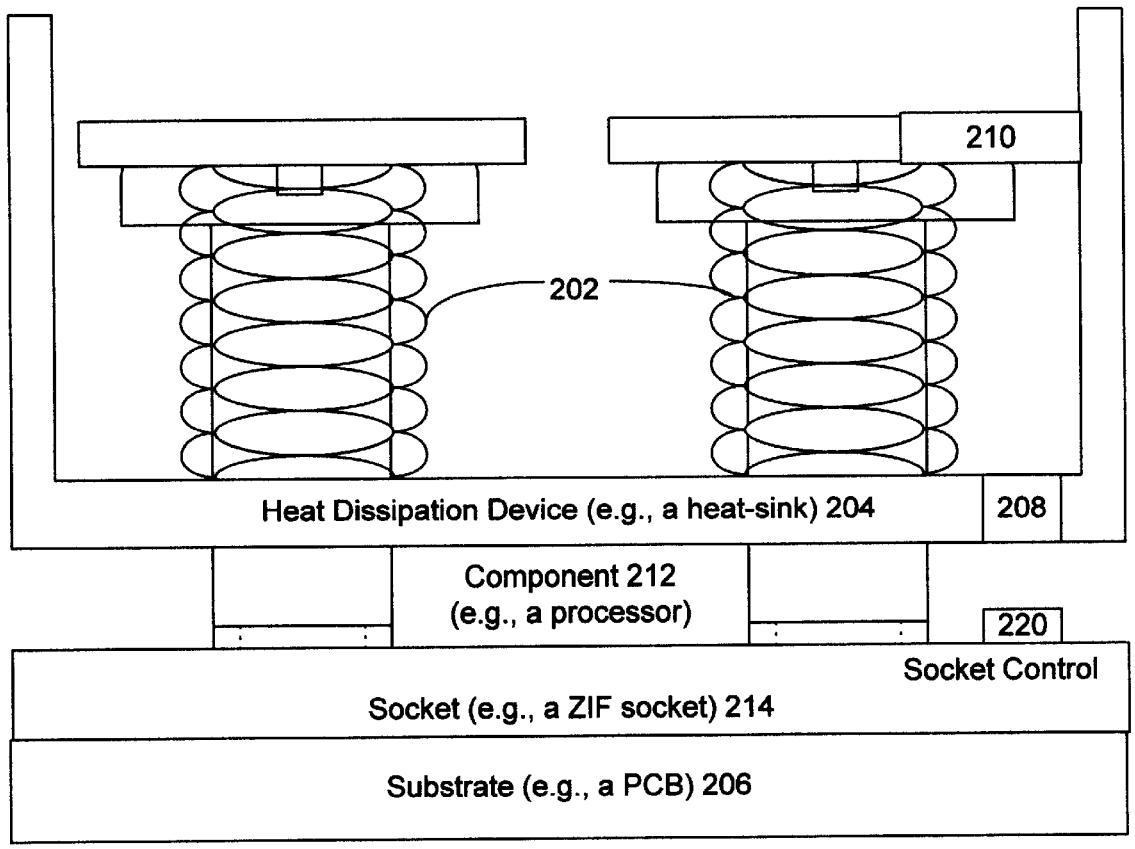
FIG. 5 illustrates a side view of a preferred embodiment of the present invention, where the activation interlock is in a closed and engaged position.

FIG. 5 illustrates a side view of a preferred embodiment of the present invention, where the activation interlock 210 is in a closed and engaged position. This embodiment has four quarter-turn retention hardware pieces 202 to attach a heat dissipation/attachment device 204 to a substrate 206 on top of a component 212 and socket 214. A hole 208 provides access to engage or disengage the socket 214, and the activation interlock 210 is attached to one of the quarter-turn retention hardware pieces 202 so that when the quarter-turn retention hardware piece 202 is rotated 90 degrees clockwise into the closed and engaged position, the activation interlock 210 blocks operator access to the hole 208 used to access socket control 220 to engage or disengage the socket 214.

Figure 6:
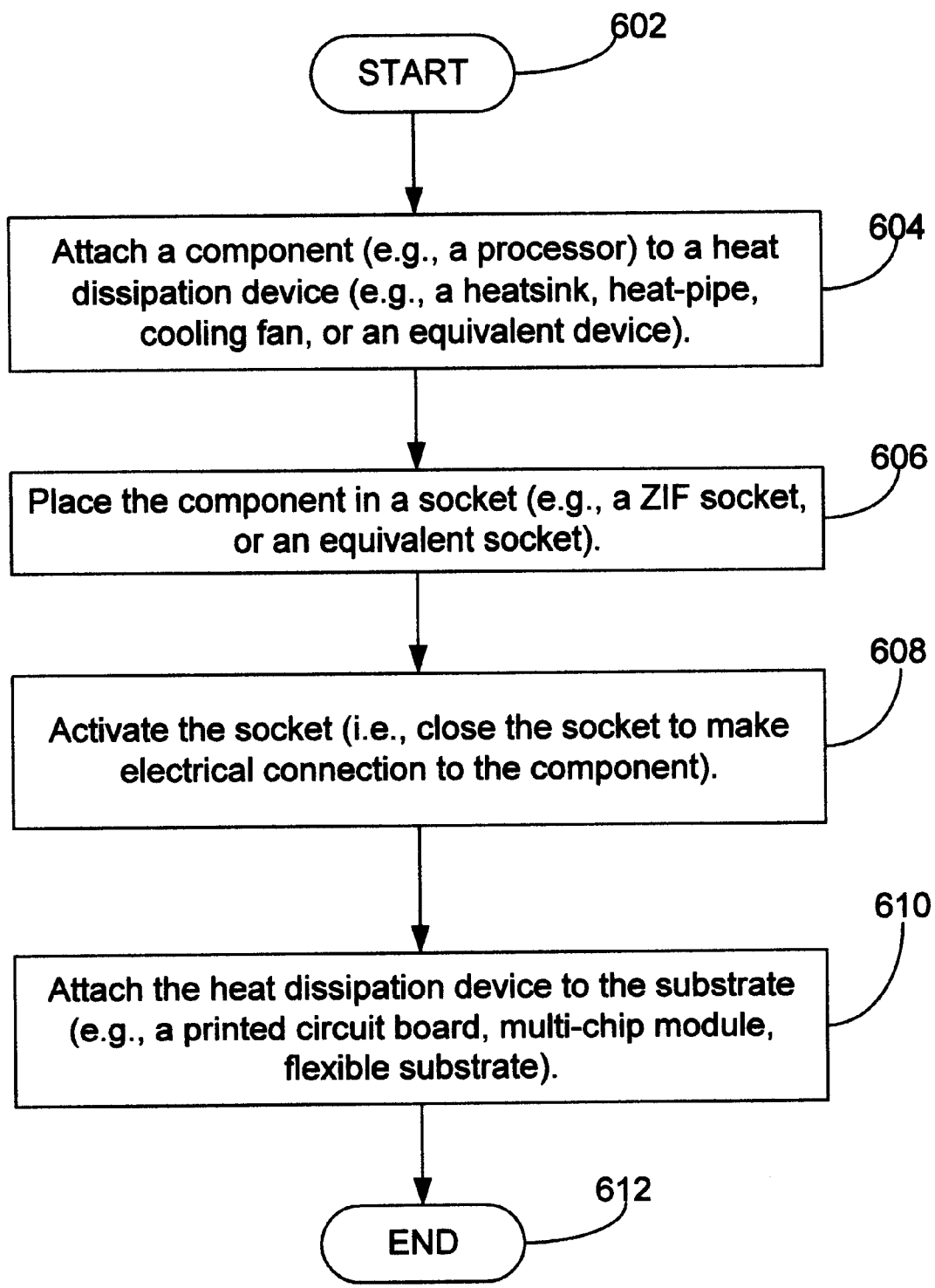
FIG. 6 illustrates a flow chart for a method to assemble a component and heat dissipation/attachment device on a substrate using an activation interlock in accordance with one embodiment of the present invention.

FIG. 6 illustrates a flow chart for a method to assemble a component and heat dissipation/attachment device on a substrate using an activation interlock in accordance with one embodiment of the present invention. The method starts in operation 602, and is followed by operation 604. In operation 604, there is an attachment of a component to a heat dissipation/attachment device. In operation 606, the component is placed in a socket on a substrate. Then operation 608 is next. In operation 608 the operator closes and engages the socket. In operation 610, the operator attaches the heat dissipation/attachment device to the substrate (e.g., using quarter-turn retention hardware, or an equivalent attachment method). Operation 612 is the end of the method. If operation 610 and 608 were accidentally reversed by the operator in a situation without an activation interlock, damage would be created to the socket, substrate, and/or the component.

Figure 7:
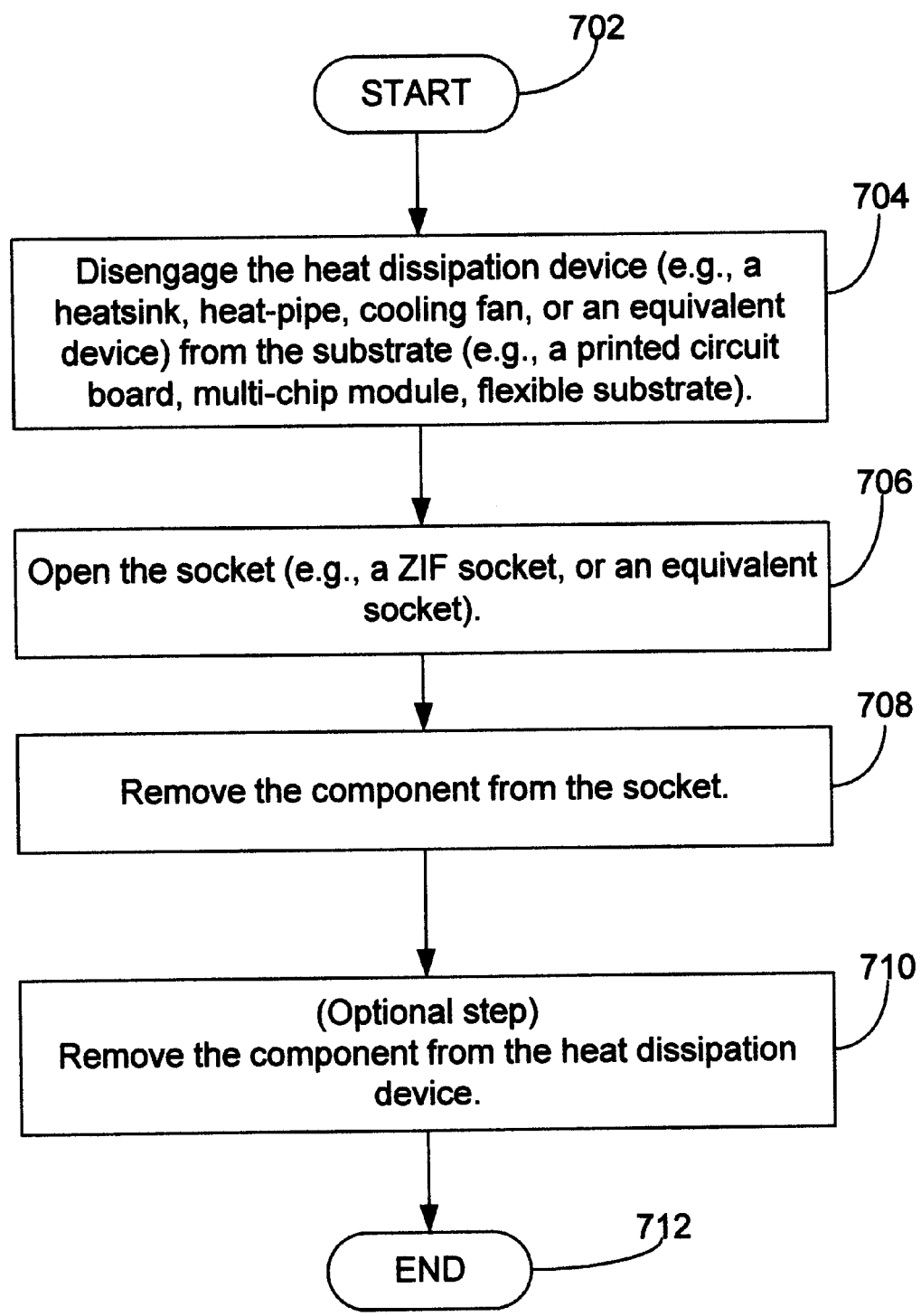
FIG. 7 illustrates a flow chart for a method to disassemble a component and heat dissipation/attachment device on a substrate using an activation interlock in accordance with one embodiment of the present invention.

FIG. 7 illustrates a flow chart for a method to disassemble a component and heat dissipation/attachment device on a substrate using an activation interlock in accordance with one embodiment of the present invention. The method starts in operation 702, and is followed by operation 704. In operation 704, there is a disassembly (i.e., disengagement) of a heat dissipation/attachment device from a substrate, by disengaging the assembly hardware (e.g., quarter-turn retention hardware, or an equivalent attachment hardware). In operation 706, a socket is opened on the substrate. Then operation 708 is next, where the operator removes a component (e.g., a processor, or another electronic device) from the socket. In optional operation 710, the operator removes the component from the heat dissipation/attachment device. Operation 712 is the end of the method. If operation 704 and 706 were accidentally reversed by the operator in disassembling a substrate without an activation interlock, damage would be created to the socket, substrate, and/or the component.

The embodiments of the invention discussed above used examples of PCBs. Preferred embodiments of the invention can be applied to PCBs using through-hole technology or surface mount technology, or can be applied to other types of electrical component substrates (e.g., multi-chip modules and flexible substrates).

The exemplary embodiments described herein are for purposes of illustration and are not intended to be limiting. Therefore, those skilled in the art will recognize that other embodiments could be practiced without departing from the scope and spirit of the claims set forth below.

What is claimed is:

1. A method to assemble a component and heat dissipation/attachment device to a socket on a substrate using an activation interlock, comprising:

attaching said component to said heat dissipation/attachment device;

placing said component in said socket on said substrate;

activating said socket to engage said component in said socket; and attaching said heat dissipation/attachment device to said substrate using an activation interlock, wherein said activation interlock prevents attachment of said heat dissipation/attachment device to said substrate until after said socket is activated.

2. The method of claim 1, wherein said socket is a zero-insertion-force (ZIF) socket.

3. The method of claim 1, wherein said activation interlock blocks attachment of said heat dissipation/attachment device to said substrate by blocking a hole in said heat dissipation/attachment device.

4. The method of claim 1, wherein said substrate is chosen from substrates consisting of: a printed circuit board (PCB), a multi-chip module (MCM), and a flexible substrate.

5. The method of claim 1, wherein said heat dissipation/attachment device is chosen from the group of heat dissipation/attachment devices consisting of: a heatsink, a heat-pipe, an attachment device, or a cooling fan.

6. The method of claim 1, wherein said activation interlock is fabricated from a group of materials consisting of: a piece of sheet metal, a molded piece of metal, a machined piece of metal, a molded piece of plastic, or a machined piece of plastic.

7. A method to disassemble a component and heat dissipation/attachment device from a socket on a substrate using an activation interlock, comprising:

disengaging said heat dissipation/attachment device from said substrate;

opening said socket; and removing said component from said socket, wherein said activation interlock prevents said opening of said socket until after disengaging said heat dissipation/attachment device from said substrate.

8. The method of claim 7, further comprising:

removing said component from said heat dissipation/attachment device, after removing said component from said socket.

9. The method of claim 7, wherein said socket is a zero-insertion-force (ZIF) socket.

10. The method of claim 7, wherein said activation interlock blocks said opening of said socket until after said disengagement of said heat dissipation/attachment device from said substrate by blocking a hole in said heat dissipation/attachment device.

11. The method of claim 7, wherein said substrate is chosen from substrates consisting of: a printed circuit board (PCB), a multi-chip module (MCM), and a flexible substrate.

12. The method of claim 7, wherein said heat dissipation/attachment device is chosen from the group of heat dissipation/attachment devices consisting of: a heatsink, a heat-pipe, an attachment device, or a cooling fan.

13. The method of claim 7, wherein said activation interlock is fabricated from a group of materials consisting of: a piece of sheet metal, a molded piece of metal, a machined piece of metal, a molded piece of plastic, or a machined piece of plastic.

14. An assembled substrate with an activation interlock to limit operator ability to open and close a socket holding a component, relative to the engagement and disengagement of a heat dissipation/attachment device attached to said component, comprising:

a substrate;

a socket mounted on said substrate, including a socket control to open or close said socket;

a component inserted in said socket; and a heat dissipation/attachment device attached by one or more retention hardware pieces to said substrate, wherein said heat dissipation/attachment device includes an activation interlock to limit operator access to said socket control.

15. The assembled substrate of claim 14, wherein said socket is a zero-insertion-force (ZIF) socket.

16. The assembled substrate of claim 14, wherein said activation interlock blocks a hole to force operator attachment of said heat dissipation/attachment device to said substrate after activation of said socket.

17. The assembled substrate of claim 14, wherein said activation interlock blocks a hole to force operator opening of said socket after disengagement of said heat dissipation/attachment device from said substrate.

18. The assembled substrate of claim 14, wherein said substrate is chosen from substrates consisting of: a printed circuit board (PCB), a multi-chip module (MCM), and a flexible substrate.

19. The assembled substrate of claim 14, wherein said heat dissipation/attachment device is chosen from the group of heat dissipation/attachment devices consisting of: a heatsink, a heat-pipe, an attachment device, or a cooling fan.

20. The assembled substrate of claim 14, wherein said activation interlock is fabricated from a group of materials consisting of: a piece of sheet metal, a molded piece of metal, a machined piece of metal, a molded piece of plastic, or a machined piece of plastic.

21. An assembled substrate that limits operator ability to open and close a socket holding a component relative to the engagement and disengagement of a heat dissipation/attachment device attached to said component, comprising:

a substrate;

a socket mounted on said substrate, including a socket control to open or close said socket;

a component inserted in said socket;

a heat dissipation/attachment device attached to said component and separately attached to said substrate; and an activation interlock that prevents operation of said socket control when said heat dissipation/attachment device is attached to said substrate.

22. The assembled substrate of claim 21, wherein said socket is a zero-insertion-force (ZIP) socket.

23. The assembled substrate of claim 21, wherein said activation interlock blocks operator access through an access hole for said socket control when said heat dissipation/attachment device is attached to said substrate.

24. The assembled substrate of claim 21, wherein said substrate is chosen from substrates consisting of: a printed circuit board (PCB), a multi-chip module (MCM), and a flexible substrate.

25. The assembled substrate of claim 21, wherein said heat dissipation/attachment device is chosen from the group of heat dissipation/attachment devices consisting of: a heatsink, a heat-pipe, an attachment device, or a cooling fan.

26. The assembled substrate of claim 21, wherein said activation interlock is fabricated from a group of materials consisting of: a piece of sheet metal, a molded piece of metal, a machined piece of metal, a molded piece of plastic, or a machined piece of plastic.

* * * * *